(12) United States Patent
Wang et al.

(10) Patent No.: US 8,270,204 B2
(45) Date of Patent: Sep. 18, 2012

(54) DOMAIN WALL MOVEMENT ON MAGNETIC STRIP TRACKS

(75) Inventors: Xiaobin Wang, Chanhassen, MN (US); Haiwen Xi, Prior Lake, MN (US); Yiran Chen, Eden Prairie, MN (US); Yuan Yan, San Jose, CA (US); Jun Zheng, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 525 days.

(21) Appl. No.: 12/500,263

(22) Filed: Jul. 9, 2009

(65) Prior Publication Data

US 2010/0090687 A1 Apr. 15, 2010

Related U.S. Application Data

(60) Provisional application No. 61/104,087, filed on Oct. 9, 2008, provisional application No. 61/104,080, filed on Oct. 9, 2008.

(51) Int. Cl.
*G11C 11/00* (2006.01)

(52) U.S. Cl. ...... 365/158; 365/171; 365/209; 365/225.5

(58) Field of Classification Search ............ 365/158, 365/80, 87, 171, 209, 225.5
See application file for complete search history.

(56) References Cited

U.S. PATENT DOCUMENTS

| | | | |
|---|---|---|---|
| 6,834,005 | B1 | 12/2004 | Parkin |
| 7,031,178 | B2 | 4/2006 | Parkin |
| 7,236,386 | B2 | 6/2007 | Parkin |
| 7,876,595 | B2 * | 1/2011 | Xi et al. .......................... 365/80 |
| 2009/0316462 | A1 * | 12/2009 | Xi et al. .......................... 365/87 |

OTHER PUBLICATIONS

U.S. Appl. No. 12/144,705, filed Jun. 24, 2008, entitled: Magnetic Tracks with Domain Wall Storage Anchors, Inventor: Haiwen Xi et al.
U.S. Appl. No. 12/233,760, filed Sep. 19, 2008, entitled: Magnetic Shift Register as Counter and Data Storage Device, Inventor: Haiwen Xi et all.
Sinitsyn et al., Geometric Control Over the Motion of Magnetic Domain Walls, Physical Review B 77, 212405 (2008).

* cited by examiner

*Primary Examiner* — Toan Le
(74) *Attorney, Agent, or Firm* — Mueting, Raasch & Gebhardt PA

(57) ABSTRACT

Magnetic shift tracks or magnetic strips, to which application of a rotating magnetic field or by rotation of the strip itself allows accurate determination of domain wall movement. One particular embodiment is a method of determining a position of a domain wall in a magnetic strip. The method includes applying a rotating magnetic field to the magnetic strip, the magnetic field rotating around a longitudinal axis of the magnetic strip, and after applying the magnetic field, determining a displacement of the domain wall to a second position.

11 Claims, 4 Drawing Sheets

DOMAIN WALL MOVEMENT ON MAGNETIC STRIP TRACKS

RELATED APPLICATIONS

This application claims priority to U.S. provisional patent application No. 61/104,087, filed on Oct. 9, 2008 and titled "Robust Domain Wall Positioning on Magnetic Strip Tracks Through Rotational Fields" and to U.S. provisional patent application No. 61/104,080, filed on Oct. 9, 2008 and titled "Accurate Rotation Angle Detector Through Domain Wall Motion on Magnetic Strip Tracks". The entire disclosure of application Nos. 61/104,087 and 61/104,080 is incorporated herein by reference.

BACKGROUND

In recent years, the commercial market for memory has gradually shifted from that for personal, desk top computers to consumer devices such as handheld or portable music players, communication devices, computing devices, and combinations of these features in one device. Due to the smaller and smaller size of these portable devices, memory with higher density and speed, lower power consumption, and small size is in high demand.

Extensive development has been directed to non-volatile memory devices including FLASH, polymer random access memory (RAM), magnetic RAM (MRAM), ferroelectric RAM (FeRAM) and resistance RAM (RRAM). Magnetic shift registers have been proposed as an alternative to these RAM devices, as magnetic shift registers can store and access a large number of data bits using just a few logic elements and at a low cost.

In magnetic shift registers, data writing and reading is accomplished by moving magnetic domain walls to a certain location by current. However, it is a challenge to accurately determine the position of a domain wall.

BRIEF SUMMARY

The present disclosure relates to magnetic shift registers, magnetic shift tracks or magnetic strips, in which magnetic domain walls are moved by electric current. Application of a rotating magnetic field or by rotation of the strip itself allows accurate determination of domain wall movement.

In one particular embodiment, this disclosure provides a method of determining a position of a domain wall in a magnetic strip. First, a magnetic strip having a domain wall at a first position is provided, the domain wall formed by meeting of opposite directions of magnetic moments. The method includes applying a rotating magnetic field to the magnetic strip, the magnetic field rotating around a longitudinal axis of the magnetic strip, and after applying the magnetic field, determining a displacement of the domain wall to a second position.

In another particular embodiment, this disclosure provides a method of determining an angle of rotation of a magnetic strip. Again, a magnetic strip having a domain wall at a first position is provided, the domain wall formed by meeting of opposite directions of magnetic moments. The method includes rotating the magnetic strip an angle to move the domain wall to a second position, measuring a displacement of the domain wall to the second position, and calculating the angle of rotation base on the displacement.

In yet another particular embodiment, this disclosure provides a rotational sensor for determining an angle of rotation. The sensor includes a magnetic strip rotatable around a longitudinal axis, a domain wall measurement system for determining the location of a domain wall in the magnetic strip, and electronics for calculating an angle of rotation of the magnetic strip based on the location of the domain wall.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure is to systems that utilize domain wall motion in a magnetic strip track. The track is magnetized in small sections, referred to herein as domains, in one direction or another. Between adjacent domains are domain walls, which is a concentration of a change in magnetism from one direction to another in a very small space. In a magnetic material with domain walls, a current passed across the domain wall moves the domain wall in the direction of the electron current flow. As the current passes through a domain wall, the current exerts spin torque on the domain wall and then drags the domain wall to move with it.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Figure 1:
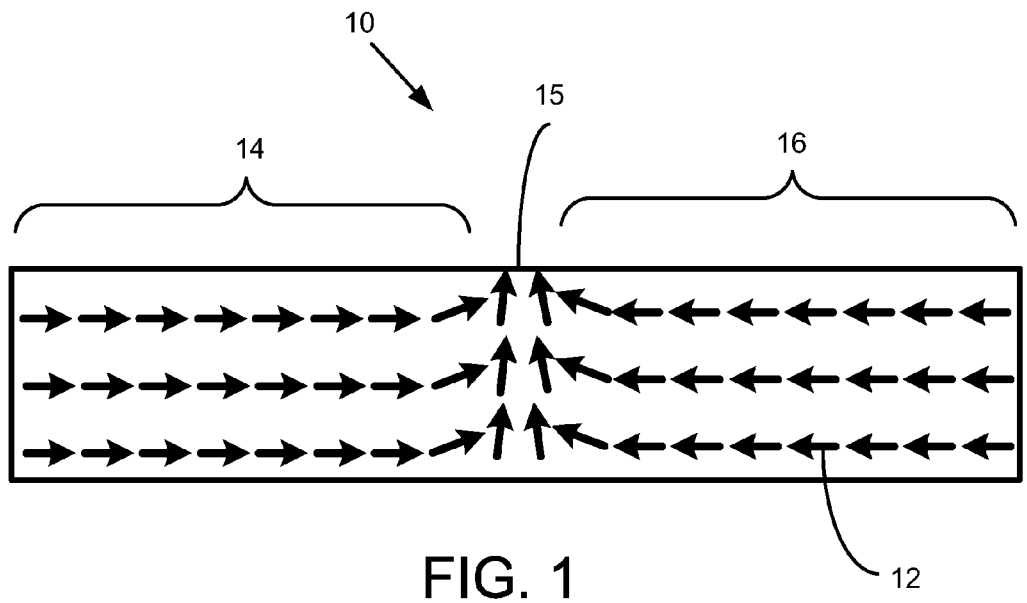
FIG. 1 is a schematic diagram of a magnetic strip illustrating two domains and a domain wall.

In magnetic shift registers, data writing and reading is accomplished by moving magnetic domain walls in a magnetic track by electric current. An in-plane electric current de-pins the domain wall and moves it to the next location. FIG. 1 illustrates the concept of domains and domain walls as used in conjunction with the present disclosure. FIG. 1 shows an exemplary magnetic strip 10 with two domains 14, 16 and a domain wall 15. The arrows, such as arrow 12, represent a magnetic moment, or dipole, and indicate local magnetization directions. The magnetic moments in domain 14 point to the right, while the magnetic moments in domain 16 point to the left. Domain wall 15 is the region in which domains 14, 16 of opposite polarity meet. The change of magnetism between domain 14 and domain 16 is concentrated in the small domain wall 15, creating a large dipolar fringing field emanating from the surface of the layer. This domain wall carries a data bit, either as a "0" or "1", depending on the direction of magnetic moment.

Magnetic strip 10 is formed from a relatively soft magnetic material, a material with high momentum, low coercivity, low uniaxial anisotropy, and large exchange coupling, the magnetization of which can be altered by being exposed to a magnetic field. Examples of soft magnetic materials include ferromagnetic materials such as Ni, Co, Fe, alloys thereof, such as NiFe and CoFe, and ternary alloys such as CoNiFe. Magnetic strip 10 is usually about 50 nm-5 micrometers wide (although thinner and thicker tracks are suitable) with an extended length.

The present disclosure provides various systems for determining the movement of domain walls on a magnetic track by utilizing principles of magnetic shift tracks. In a first system, described in reference to FIGS. 2 through 4, a rotating magnetic field is applied to the magnetic track. The movement of the domain wall, in the presence of the rotating magnetic field, is directly related to the width of the domain wall and to the magnetic track magnetic material. The position of the domain can be accurately controlled or accurately determined. In a second system, described in reference to FIG. 5 and FIGS. 6A-6C, the movement of the domain wall is used to determine an angle or rotation of the magnetic strip, which can be applied to a rotational measurement object, such as a gyroscope.

Figure 2:
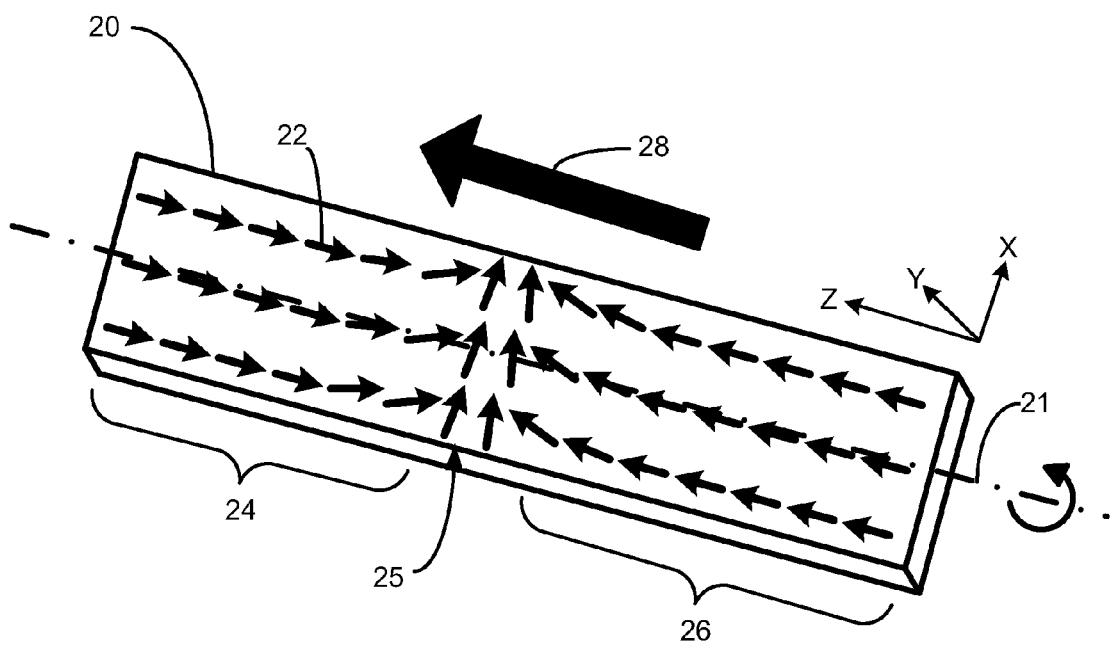
FIG. 2 is a schematic diagram of a magnetic strip with a rotating magnetic field.
Figure 3:
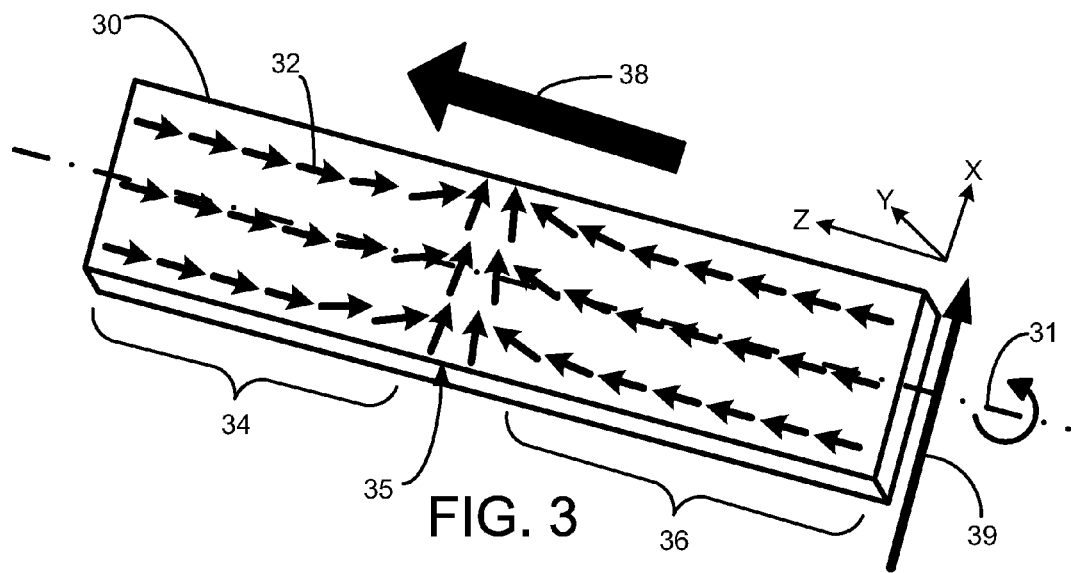
FIG. 3 is a schematic diagram of a magnetic strip with a rotating magnetic field and a DC magnetic field.
Figure 4:
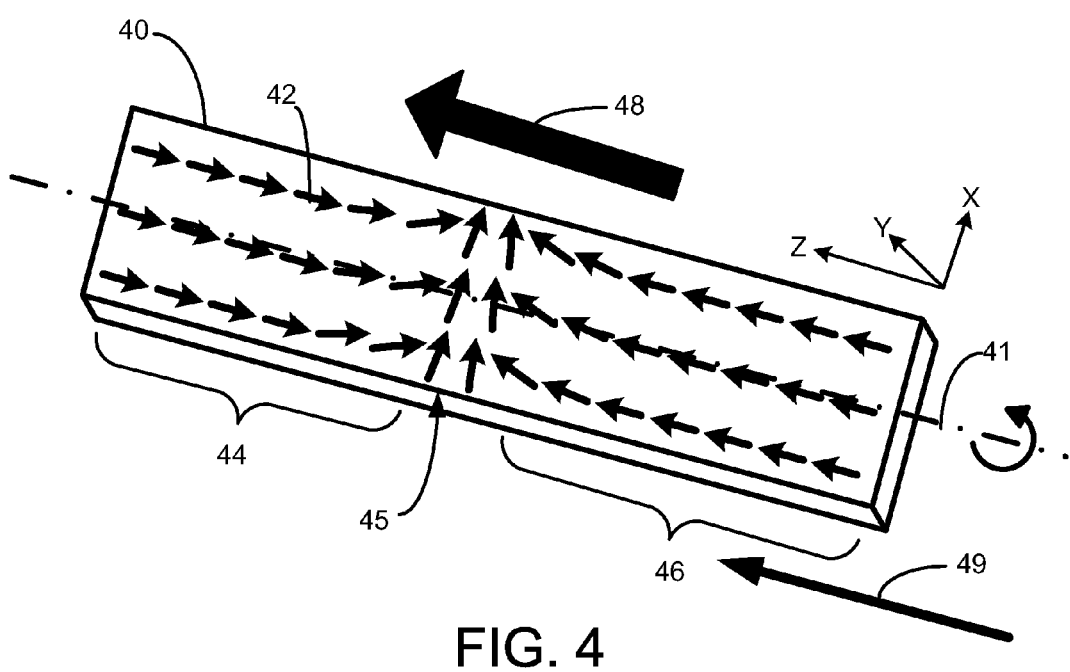
FIG. 4 is a schematic diagram of a magnetic strip with a rotating magnetic field and a DC current.

Referring to FIGS. 2 to 4, various embodiments for accurately controlling or determining a domain wall position are shown. In these embodiments, a rotational magnetic field is added to the magnetic strip, in a direction generally perpendicular to the motion of the domain wall. As seen in FIG. 2, magnetic strip 20 has a plurality of magnetic moments 22 arranged in a first domain 24 and a second domain 26, which meet at a domain wall 25.

A magnetic field, centered on and rotating around a Z-axis 21 of strip 20, rotates the magnetization of domain wall 25. After one period (i.e., 360°) of magnetization rotation, domain wall 25 moves a distance along strip 20 in the direction of arrow 28. The distance domain wall 25 moves is defined by $2\pi D/\alpha$ where D is the domain wall width (in the Z-direction) and $\alpha$ is a damping parameter of the magnetic material of strip 20.

The distance of displacement of wall 25 does not depend upon the magnetic field or the rate of its rotation. The magnetic field rate of rotation does need to sufficiently high enough to overcome domain wall pinning yet at the same time be sufficiently low to enable magnetization relaxation. For typical ferromagnetic strip 20, the rotational field magnitude is about 50 to about 100 Oe; the rotational frequency is in MHz range. The magnetic field can be adjusted by controlling the amplitude of the AC current used to generate the magnetic field. Additionally, the distance of displacement does not explicitly depend upon detailed magnetic material parameters (of strip 20) such as magnetic anisotropy, saturation, etc. Rather, the displacement distance of wall 25 only depends upon domain wall width and magnetic damping parameter.

In order to reduce the AC current amplitude when producing the rotating magnetic field, a DC magnetic field or a DC current can be added to overcome domain wall pinning. FIG. 3 illustrates the addition of a DC magnetic field and FIG. 4 illustrates the addition of a DC current.

In FIG. 3, magnetic strip 30 has a plurality of magnetic moments 32 arranged in a first domain 34 and a second domain 36, which meet at a domain wall 35. A magnetic field, centered on and rotating around a Z-axis 31 of strip 30, rotates the magnetization of domain wall 35. Also acting on domain wall 35 is a DC magnetic field, applied in the X-direction, identified by arrow 39. In some embodiments, the DC magnetic field has a magnitude of 100-1000 Oe. By the application of DC magnetic field 39, the rotating magnetic field has a lower amplitude than if no DC magnetic field were present. As described in regards to FIG. 2 above, after one period (i.e., 360°) of magnetization rotation, domain wall 35 moves a distance along strip 30 in the direction of arrow 38.

In FIG. 4, magnetic strip 40 has a plurality of magnetic moments 42 arranged in a first domain 44 and a second domain 46, which meet at a domain wall 45. A magnetic field, centered on and rotating around a Z-axis 41 of strip 40, rotates the magnetization of domain wall 45. Also acting on domain wall 45 is a DC current, applied in the longitudinal Z-direction, identified by arrow 49. In some embodiments, the amplitude of the DC current is $10^6$-$10^7$ Amps/cm$^2$. By the application of DC magnetic field 49, the rotating magnetic field has a lower amplitude than if no DC magnetic field were present. As described in regards to FIG. 2 above, after one period (i.e., 360°) of magnetization rotation, domain wall 45 moves a distance along strip 40 in the direction of arrow 48.

The amplitudes of both DC field 39 and DC current 49 of FIG. 3 and FIG. 4, respectively, are below the critical domain depinning field and current values. Thus, while DC field 39 or DC current 49 helps depinning of domain wall 35, 45 and decreases the needed AC field magnitude, the displacement of domain wall 35, 45 is purely determined by rotation of the magnetization. By utilizing a rotating magnetic field, domain wall positioning can be accurately determined.

Similarly, by utilizing domain wall positioning or displacement, degree of rotation can be accurately determined. The measurement of rotation of items, such as rigid solids, is of considerable interest but also challenge in a number of areas. Rotational measurement has broad applications, for example in navigation, industry control and consumer electronics.

Figure 5:
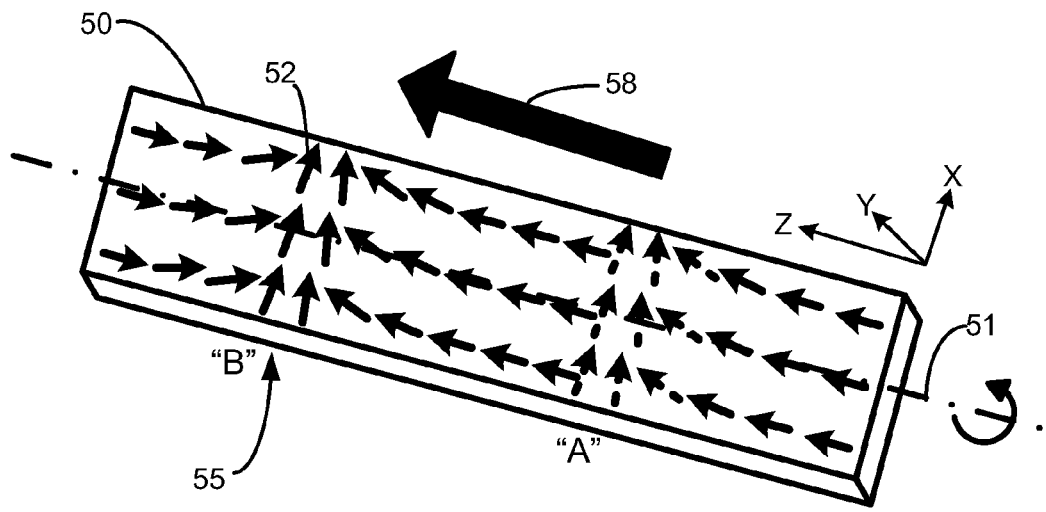
FIG. 5 is a schematic diagram of a rotating magnetic strip.

Referring to FIG. 5 and FIGS. 6A-6C, a system for determining an angle of rotation of the magnetic strip are shown. In these systems, rotational angle magnitude is determined by domain wall displacement along the strip, independent of rotating speed variation and micro-magnetic properties variation. As seen in FIG. 5, magnetic strip 50 has a plurality of magnetic moments 52 that form a domain wall 55 where moments 52 of opposite direction meet. In FIG. 5, domain wall 55 has moved from a first location A (where domain wall 55 is illustrated in phantom) to a second location B.

As described above, the displacement distance of a domain wall during one full rotation (i.e., 360°) is defined by $2\pi D/\alpha$ where D is the domain wall width (in the Z-direction) and $\alpha$ is a damping parameter of the magnetic material of strip 50. Thus by knowing the displacement distance from location A to location B, the angle of rotation (in degrees) can be calculated from $2\pi D/360\alpha$.

Although the distance of displacement of wall 55 does not depend upon the rate of rotation of strip 50, in most embodiments, including permalloy NiFe strips 50, the rate or rotation is from MHz to GHz. Additionally, the degree of rotation, as a distance of displacement (e.g., from location A to location B), does not explicitly depend upon the detailed magnetic material parameters (of strip 50) such as magnetic anisotropy, saturation, etc. Rather, the displacement distance of wall 55 only depends upon domain wall width and magnetic damping parameter of strip 50. Changing the magnetic material of strip 50, the width (in the Z-direction) of domain wall 55 and/or damping parameter of strip 50 can modify the sensitivity of the angle detector. The detector frequency range (e.g., MHz to GHz) is dependant on the rotational rate being sufficiently high to overcome domain wall pinning and at the same time sufficiently low to guarantee magnetization relaxation.

Figure 6A:
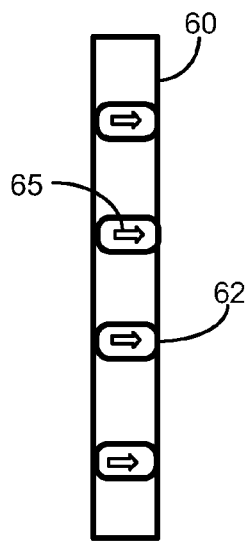
FIG. 6A is a schematic top diagram of a magnetic strip having a plurality of anchors for a domain wall.
Figure 6B:
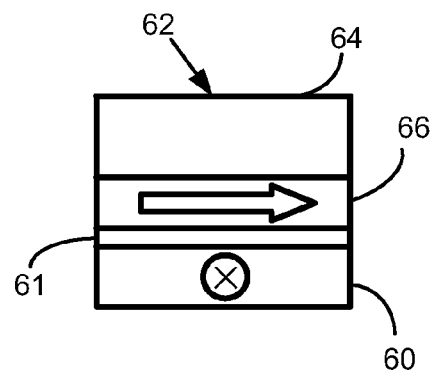
FIG. 6B is a schematic side view of a domain wall anchor.
Figure 6C:
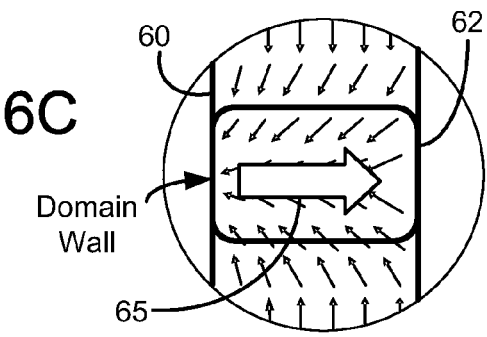
FIG. 6C is an enlarged schematic top diagram of an anchored domain wall.

Determination of magnetic domain wall position and is movement can be based on, but not limited to, different magneto-resistance effects, such as anisotropic magnetoresistance (AMR), giant magnetoresistance (GMR) or tunneling magnetoresistance (TMR) or magnetic tunnel effect. FIGS. 6A-6C shows schematic diagrams of elements for determining domain wall position with a TMR stack.

In FIGS. 6A-6C, a magnetic strip 60 has a plurality of anchors 62 in close proximity thereto, for stabilizing a domain wall; in this embodiment, anchors 62 are positioned on strip 60. In this embodiment, anchors 62 include a TMR stack composed of a ferromagnetic (FM) layer 66 with a magnetization orientation spaced from strip 60 by a barrier oxide layer 61 (e.g., $Al_2O_3$, $TiO_x$, MgO). In FIG. 6A, the magnetization orientation direction of FM layer 66 is represented by arrow 65. Electrically connected to FM layer 66 is an electrode layer 64, such as a nonmagnetic metal, to operably connect FM layer 66 to a voltage source to provide a current through anchor 62.

FM layer 66 is formed from a soft magnetic material that has a magnetization orientation that can be altered by being exposed to a magnetic field. However, the material of FM layer 66 is harder than the material of strip 60, so that a greater magnetic field is needed to alter the magnetization of FM layer 66 that of strip 60. Thus, FM layer 66 can be referred to as a "pinned layer" relative to strip 60, which can be referred to as a "free layer". Together, FM layer 66, barrier layer 61 and strip 60 proximate barrier layer 21 form a TMR stack, such as a magnetic tunnel junction cell (MTJ).

The magnetization orientation or magnetic moments of strip 60 are generally perpendicular to magnetization orientation 65 of FM layer 66 in locations where no domain wall is present. In locations where a domain wall is present (see FIG. 6C), the magnetization orientation of strip 60 will be in the same direction (i.e., parallel) or opposite direction (i.e., antiparallel) to magnetization orientation 65 of FM layer 66. The resistance across anchor 62 (i.e., across strip 60 and FM layer 66) will indicate any presence of a domain wall and the relative orientation of strip 60 to magnetization orientation 65 of FM layer 66.

The various elements of magnetic strips and the systems of this disclosure can be made by thin film building and removal techniques such as chemical vapor deposition (CVD), physical vapor deposition (PVD), atomic layer deposition (ALD), photolithography, dry etching, wet etching, and/or ion milling.

Figure 7:
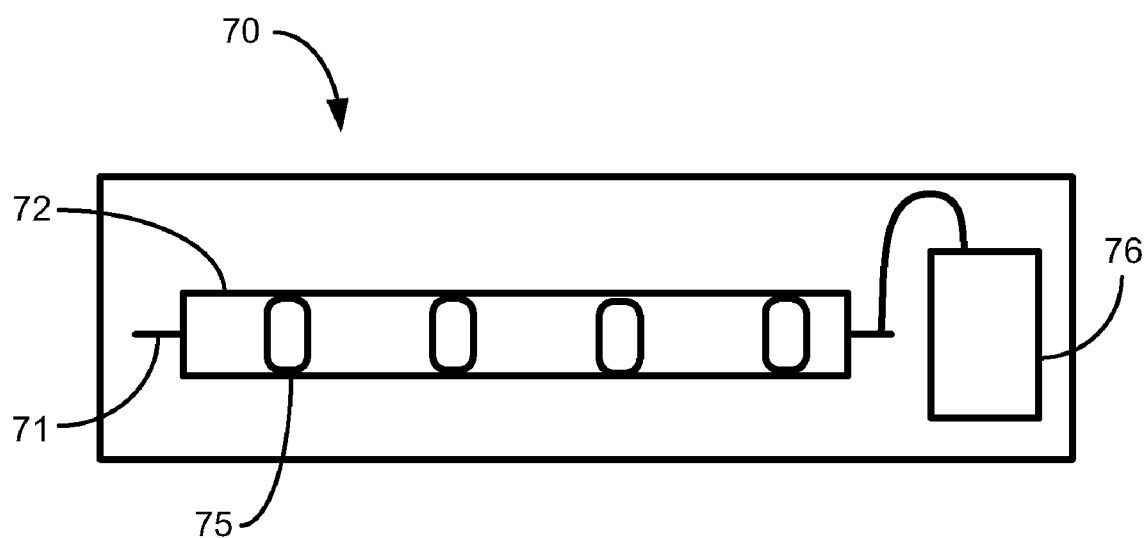
FIG. 7 is a schematic diagram of a rotational sensor.

Using a magnetic strip with a rotating magnetic field allows accurate determination of domain wall movement. In other embodiments, by knowing the domain wall movement, the degree of rotation of the strip can be accurately determined. This is useful for angular motion sensors. FIG. 7 illustrates a basic angular motion sensor 70, which includes a magnetic strip 72 having a longitudinal axis 71, which extends parallel to the direction in which domain walls within strip 72 move. Strip 72 is configured for rotation about axis 71. In this embodiment, strip 72 includes at least one domain wall anchor 75, for stabilizing a domain wall. In some embodiments, anchor 75 is a magnetic tunnel junction cell, or the like. Sensor 70 includes electronics 76 for calculating an angle of rotation of magnetic strip 70 around axis 71 based on the location of the domain wall. Sensor 70 may be incorporated into a gyroscope or other navigational equipment.

Thus, embodiments of the DOMAIN WALL MOVEMENT ON MAGNETIC STRIP TRACKS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of determining a position of a domain wall in a magnetic strip, the method comprising:
   providing a magnetic strip having a domain wall at a first position, the domain wall formed by meeting of opposite directions of magnetic moments;
   applying a rotating magnetic field to the magnetic strip, the magnetic field rotating around a longitudinal axis of the magnetic strip; and
   after applying the magnetic field, determining a displacement of the domain wall to a second position, wherein determining the displacement comprises calculating the displacement over one rotation of the magnetic field by $2\pi D/\alpha$, where D is the domain wall width and $\alpha$ is a damping parameter of the magnetic strip.

2. The method of claim 1 wherein applying a rotating magnetic field comprises a magnetic field rotating in the MHz range.

3. The method of claim 1 wherein applying a rotating magnetic field comprises a 50-100 Oe magnetic field.

4. The method of claim 1 further comprising applying a DC magnetic field perpendicular to the domain wall displacement.

5. The method of claim 4 wherein the DC magnetic field is 100-1000 Oe.

6. The method of claim 1 further comprising applying a DC current parallel to the domain wall displacement.

7. The method of claim 6 wherein the DC current has an amplitude of $10^6$-$10^7$ Amps/cm$^2$.

8. A method of determining an angle of rotation of a magnetic strip, the method comprising:
   providing a magnetic strip having a domain wall at a first position, the domain wall formed by meeting of opposite directions of magnetic moments;
   rotating the magnetic strip an angle to move the domain wall to a second position;
   measuring a displacement of the domain wall to the second position; and
   calculating the angle of rotation from the displacement, wherein calculating the angle of rotation comprises calculating the displacement over one rotation of the magnetic field by $2\pi D/360\alpha$, where D is the domain wall width and $\alpha$ is a damping parameter of the magnetic strip.

9. The method of claim 8 wherein rotating the magnetic strip comprises rotating the magnetic strip in the MHz range.

10. The method of claim 8 wherein rotating the magnetic strip comprises rotating the magnetic strip in the GHz range.

11. A rotational sensor comprising:
    a magnetic strip rotatable around a longitudinal axis;
    a domain wall measurement system for determining the location of a domain wall in the magnetic strip; and
    electronics for calculating an angle of rotation of the magnetic strip based on the location of the domain wall, wherein the electronics are configured to determine the angle of rotation based on $2\pi D/360\alpha$, where D is the domain wall width and $\alpha$ is a damping parameter of the magnetic strip.

* * * * *